United States Patent
Hayashi et al.

(10) Patent No.: US 7,755,202 B2
(45) Date of Patent: Jul. 13, 2010

(54) SEMICONDUCTOR DEVICE AND METHOD OF FABRICATING THE SAME

(75) Inventors: Yumi Hayashi, Kanagawa (JP); Tadayoshi Watanabe, Kanagawa (JP); Takamasa Usui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 12/059,213

(22) Filed: Mar. 31, 2008

(65) Prior Publication Data

US 2008/0246155 A1 Oct. 9, 2008

(30) Foreign Application Priority Data

Apr. 5, 2007 (JP) ............... 2007-099533

(51) Int. Cl.
*H01L 29/40* (2006.01)

(52) U.S. Cl. ............... 257/774; 257/762; 257/E23.168

(58) Field of Classification Search ............... 257/762, 257/774, E23.168
See application file for complete search history.

(56) References Cited

U.S. PATENT DOCUMENTS

| | | | |
|---|---|---|---|
| 2006/0019486 A1* | 1/2006 | Yu et al. | 438/628 |
| 2006/0186549 A1 | 8/2006 | Usami et al. | |
| 2007/0018329 A1 | 1/2007 | Oh et al. | |
| 2007/0035029 A1* | 2/2007 | Caubet et al. | 257/762 |
| 2007/0072334 A1 | 3/2007 | Orlowski et al. | |

FOREIGN PATENT DOCUMENTS

JP 2000-294634 10/2000

OTHER PUBLICATIONS

Yumi Hayashi, et al., "High Performance Ultra Low-k (k-2.0/keff=2.4) Hybrid Dielectrics/Cu Dual-Damascene Interconnects with Selective Barrier Layer for 32 nm-node", Conference Proceedings AMC XXII, 2007, 4 Pages.

* cited by examiner

*Primary Examiner*—Tan N Tran
(74) *Attorney, Agent, or Firm*—Oblon, Spivak, McClelland, Maier & Neustadt, L.L.P.

(57) ABSTRACT

A semiconductor device according to an embodiment includes: a semiconductor substrate having a semiconductor element formed on a surface thereof; an interwiring insulating film formed above the semiconductor substrate; a wiring formed in the interwiring insulating film; a first intervia insulating film formed under the interwiring insulating film; a first via formed in the first intervia insulating film and connected to a lower surface of the wiring; a second intervia insulating film formed on the interwiring insulating film; a second via formed in the second intervia insulating film and connected to an upper surface of the wiring; and a CuSiN film formed in at least one of a position between the interwiring insulating film and the first intervia insulating film, and a position between the interwiring insulating film and the second intervia insulating film.

14 Claims, 7 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2007-099533, filed on Apr. 5, 2007, the entire contents of which are incorporated herein by reference.

BACKGROUND

With enhancement of performance of recent semiconductor devices having multilayer interconnection structures, there has been shown a tendency to use a low-permittivity insulating material in each of an interwiring insulating film and an intervia insulating film. In general, the low-permittivity insulating material has a high void ratio, and thus has a property of readily containing therein moisture. When a lot of moisture is contained in each of the interwiring insulating film and the intervia insulating film, a barrier metal covering wirings and vias may be oxidized by the moisture. When the oxidization of the barrier metal progresses, there is a possibility that even the barrier metal in a bottom surface of the via and the wiring itself covered with the barrier metal are oxidized to impede the electrical conduction, thereby causing deterioration of the electrical characteristics or the like. In particular, since a ratio of a surface area to a volume is larger in the via than in the wiring, a large influence of the oxidation of the barrier metal is exerted on the via.

A semiconductor device in which a plasma silicon oxide film is formed between an interwiring insulating film and an intervia insulating film is known as the related art in this field. This semiconductor device, for example, is disclosed in Japanese Patent KOKAI No. 2000-294634. According to this semiconductor device, it is possible to obtain a large etching selectivity between each of the interwiring insulating film and the intervia insulating film, and the plasma silicon oxide film. Therefore, the plasma silicon oxide film having a film thickness of, for example, several tens of nanometers can be used as an etching stopper.

However, according to the semiconductor device described in Japanese Patent KOKAI No. 2000-294634, since the plasma silicon oxide film has no function of blocking the moisture, there is a probability that the moisture in the interwiring insulating film moves to the intervia insulating film, so that not only the moisture in the intervia insulating film, but also the moisture in the interwiring insulating film promote the oxidation of the barrier metal covering the via. In addition, the plasma silicon oxide film has a large permittivity. Thus, in this case, it is feared to cause an increase in effective permittivity between the wirings.

BRIEF SUMMARY

A semiconductor device according to one embodiment includes: a semiconductor substrate having a semiconductor element formed on a surface thereof; an interwiring insulating film formed above the semiconductor substrate; a wiring formed in the interwiring insulating film; a first intervia insulating film formed under the interwiring insulating film; a first via formed in the first intervia insulating film and connected to a lower surface of the wiring; a second intervia insulating film formed on the interwiring insulating film; a second via formed in the second intervia insulating film and connected to an upper surface of the wiring; and a CuSiN film formed in at least one of a position between the interwiring insulating film and the first intervia insulating film, and a position between the interwiring insulating film and the second intervia insulating film.

A method of fabricating a semiconductor device according to another embodiment includes: forming an intervia insulating film above a semiconductor substrate having a semiconductor element formed on its surface; forming a Cu film on the intervia insulating film, exposing the Cu film to Si-containing gas to form a Cu—Si compound film, and performing nitriding processing for the Cu—Si compound film, thereby forming a CuSiN film; forming an interwiring insulating film on the CuSiN film; forming a via hole in the intervia insulating film, a wiring trench in the interwiring insulating film, and at least one of a via hole and a wiring trench in the CuSiN film, respectively; and forming a via and a wiring in the via hole and the wiring trench, respectively.

DETAILED DESCRIPTION

First Embodiment

Figure 1:
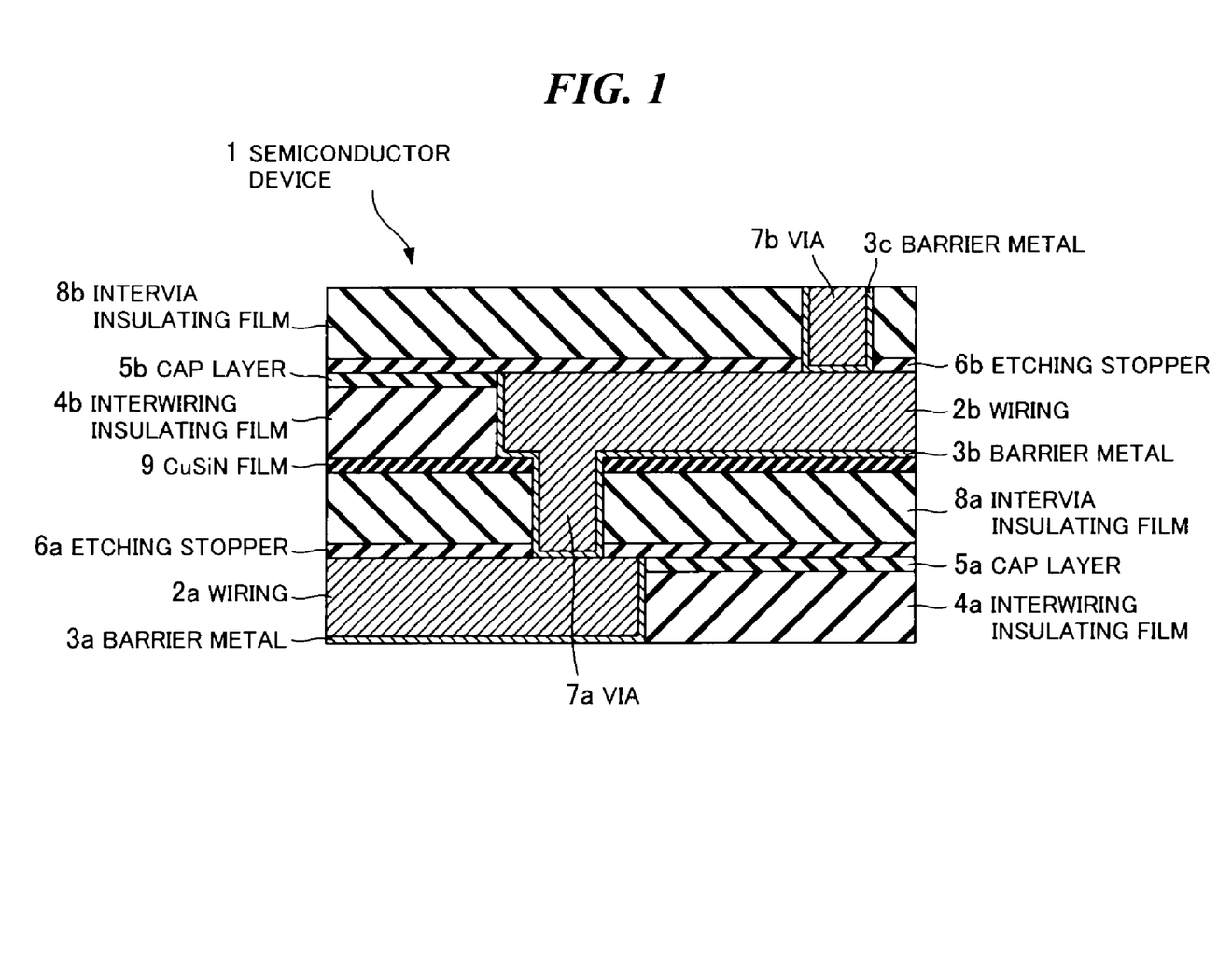
FIG. 1 is a cross sectional view of a semiconductor device according to a first embodiment.

FIG. 1 is a cross sectional view of a semiconductor device according to a first embodiment.

A semiconductor device 1 includes a semiconductor substrate (not shown) having a semiconductor element formed on its surface, and a multilayer interconnection structure laminated on the semiconductor substrate. FIG. 1 is a cross sectional view showing a part of the multilayer interconnection structure.

The semiconductor device 1 includes wirings 2a and 2b, interwiring insulating films 4a and 4b which are formed in the same layers as those of the wirings 2a and 2b, respectively, and which are formed between the wirings 2a and 2b, and peripheral wirings (not shown), respectively, a via 7a through which the wirings 2a and 2b are electrically connected to each other, a via 7b through which the wiring 2b and an upper wiring (not shown) are electrically connected to each other, and intervia insulating films 8a and 8b which are formed in the same layers as those of the vias 7a and 7b, respectively, and which are formed between the vias 7a and 7b, and peripheral vias (not shown), respectively. It is noted that the disposition of the wirings 2a and 2b, the vias 7a and 7b, and the like are by no means limited to those shown in FIG. 1.

In addition, cap layers 5a and 5b are formed on the interwiring insulating films 4a and 4b, respectively, and etching stoppers 6a and 6b are formed on the wiring 2a and the cap layer 5a, and on the wiring 2b and the cap layer 5b, respectively. Also, a barrier metal 3a is formed on a surface including a lower surface and a side surface of the wiring 2a, a barrier metal 3b is formed on surfaces including lower surfaces and side surfaces of the wiring 2b and the via 7a, and a barrier metal 3c is formed on a surface including a lower surface and a side surface of the via 7b.

A CuSiN film 9 is formed between the interwiring insulating film 4b and the intervia insulating film 8a, and between the wiring 2b and the intervia insulating film 8a.

Each of the wirings 2a and 2b, and the vias 7a and 7b, for example, is made of Cu.

Each of the barrier metals 3a, 3b and 3c, for example, is made of a metallic material such as Ta, Ti, W, Ru or Co, or a compound of these metallic materials. In addition, the barrier metals 3a, 3b and 3c have a function of preventing metals in the wirings 2a and 2b, and the vias 7a and 7b from diffusing into the adjacent members such as the interwiring insulating films 4a and 4b, and the intervia insulating films 8a and 8b.

Each of the intervia insulating films 8a and 8b is made of an insulating material such as SiOC, $SiO_2$, SiOCH or SiOF. In addition, each of the intervia insulating films 8a and 8b, for example, has a thickness of about 150 nm.

Each of the interwiring insulating films 4a and 4b can be made of the same material as that of each of the intervia insulating films 8a and 8b. In addition, each of the interwiring insulating films 4a and 4b may be made of an organic insulating material such as polyarylenes or benzoxazole. Also, each of the interwiring insulating films 4a and 4b, for example, has a thickness of about 150 nm.

Each of the cap layers 5a and 5b is made of an insulating material such as $SiO_2$, SiC, SiOCH or SiOC. The cap layers 5a and 5b are used as stoppers or the like for planarizing processing utilizing a chemical mechanical polishing (CMP) process when the wirings 2a and 2b are formed, respectively. In addition, each of the cap layers 5a and 5b, for example, has a thickness of about 100 nm. It is noted that in the case where the damage of the interwiring insulating films 4a and 4b when the CMP process or the like is carried out is not going to matter as much, the formation of the cap layers 5a and 5b may be omitted.

Each of the etching stoppers 6a and 6b is made of an insulating metal, such as SiC, SiN or SiCN, having a high etching selectivity with respect to each of the intervia insulating films 8a and 8b. The etching stoppers 6a and 6b act as stoppers when the upper members, of the wirings 2a and 2b, such as the intervia insulating films 8a and 8b are etched, respectively. In addition, the etching stoppers 6a and 6b prevent the metals in the wirings 2a and 2b from diffusing into the upper members, respectively. It is noted that the etching stoppers 6a and 6b may be formed only on the upper surfaces of the wirings 2a and 2b, respectively. Also, each of the etching stoppers 6a and 6b, for example, has a thickness of about 50 nm.

The CuSiN film 9 can block the movement of the moisture between the interwiring insulating film 4b and the intervia insulating film 8a because of its property of hardly permeating the moisture. In addition, the CuSiN film 9 has a thickness of 1 to 10 nm. The reason for this is because when the thickness of the CuSiN film 9 is thinner than 1 nm, the effect of blocking the moisture may be reduced, while when the thickness of the CuSiN film 9 is thicker than 10 nm, the effective permittivity between the peripheral wirings may be largely increased.

FIGS. 2A to 2D are respectively cross sectional views showing a method of fabricating the semiconductor device according to the first embodiment.

Figure 2A:
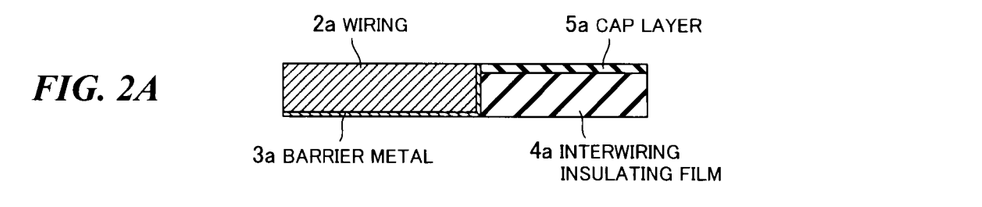
FIGS. 2A to 2D are respectively cross sectional views showing a method of fabricating the semiconductor device according to the first embodiment.

Firstly, as shown in FIG. 2A, the wiring 2a having the surface including the lower surface and the side surface covered with the barrier metal 3a, the interwiring insulating film 4a, and the cap layer 5a are formed above the semiconductor substrate (not shown). For example, after the barrier metal 3a, and a Cu film becoming the wiring 2a are formed on the interwiring insulating film 4a having the wiring trench formed therein, and the cap layer 5a by utilizing a chemical vapor deposition (CVD) method or a physical vapor deposition (PVD) method, and a plating method, respectively, the barrier metal 3a and the Cu film which are formed outside the wiring trench are removed by performing the CMP, which results in that the lower wiring 2a is formed and buried in the wiring trench.

Figure 2B:
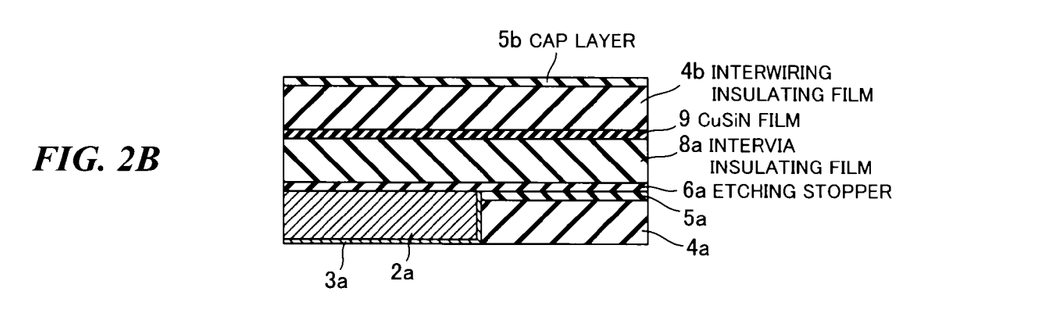

Next, as shown in FIG. 2B, the etching stopper 6a, the intervia insulating film 8a, the CuSiN film 9, the interwiring insulating film 4b, and the cap layer 5b are laminated in order on the wiring 2a and the cap layer 5a.

Here, the CuSiN film 9 is formed in processes which will be described below. Firstly, after a Cu film is formed on the intervia insulating film 8a to have a thickness of about 1 to about 10 nm by utilizing the CVD method or the PVD method, the resulting Cu film is exposed to Si-containing gas such as monosilane ($SiH_4$) gas, thereby forming a Cu—Si compound film. After that, nitriding processing is performed for the Cu—Si compound film by performing $NH_3$ plasma radiation or the like, thereby forming the CuSiN film 9. It is noted that the thickness of the CuSiN film 9 can be controlled by changing the conditions of the process described above. In addition, a time and a temperature which are required to perform each of the processes are controlled in the range of 1 to 30 seconds for each process, and in the range of 250 to 450° C. for each process, respectively.

Figure 2C:
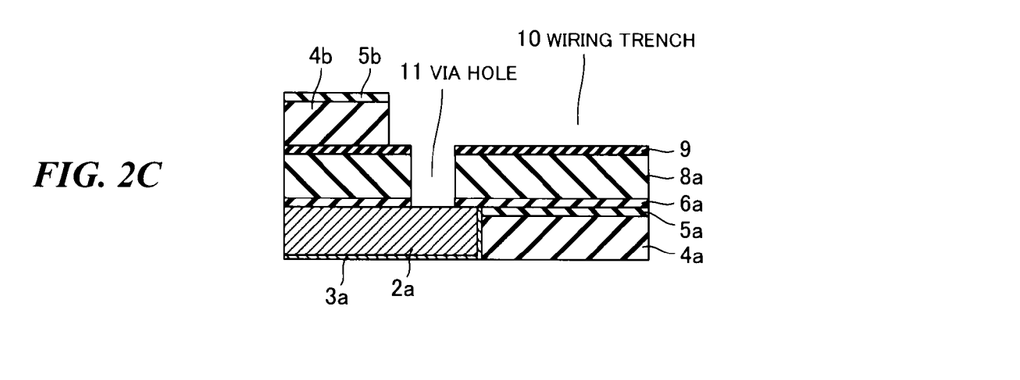

Next, as shown in FIG. 2C, the etching stopper 6a, the intervia insulating film 8a, the CuSiN film 9, the interwiring insulating film 4b, and the cap layer 5b are processed by, for example, utilizing a photolithography method and a reactive ion etching (RIE) method. As a result, a via hole 11 is formed in the etching stopper 6a, the intervia insulating film 8a, and the CuSiN film 9, and also a wiring trench 10 is formed in the interwiring insulating film 4b and the cap layer 5b. In this embodiment, the upper surface of the intervia insulating film 8a can be protected from being damaged by the etching because the CuSiN film 9 is left on the upper surface of the intervia insulating film 8a.

It is noted that after the wiring trench 10 and the via hole 11 are formed, the inner surfaces of the wiring trench 10 and the via hole 11 which are damaged by the etching may be repaired. When each of the interwiring insulating film 4b and the intervia insulating film 8a, for example, is made of a material, such as methylsiloxane, having a siloxane bond as a main skeleton, the repair is carried out by recombining a portion having a defective methyl group owing to the etching with a hydrocarbon group such as a methyl group by using a repairing agent containing organic gas having a silanol group, an organic chemical or the like.

Figure 2D:
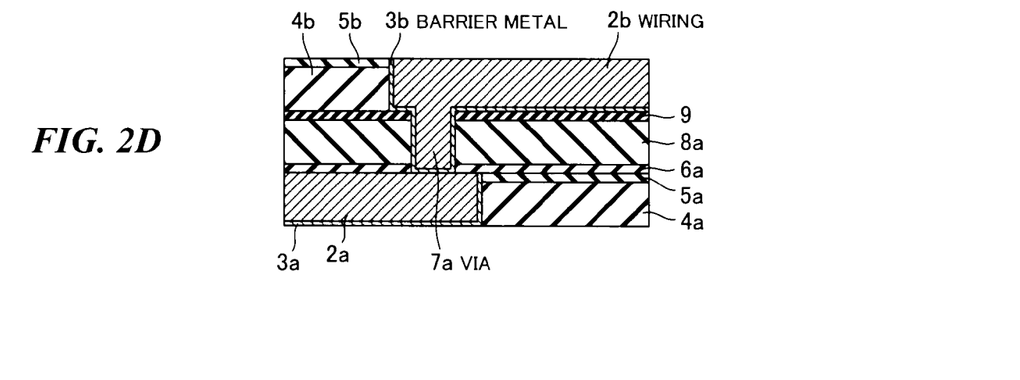

As shown in FIG. 2D, the wiring 2b and the via 7a having the respective surfaces including the lower surfaces and the side surfaces covered with the barrier metal 3b are formed in the wiring trench 10 and the via hole 11, respectively, by utilizing the same method as that in the case of the lower wiring.

Thereafter, the etching stopper 6b, the via 7b having the surface including the lower surface and the side surface covered with the barrier metal 3c, the intervia insulating film 8b, and the like are formed in the upper layer, thereby forming the semiconductor device 1 shown in FIG. 1.

According to the first embodiment, the formation of the CuSiN film 9 prevents the moisture in the interwiring insulating film 4b from moving to the intervia insulating film 8a. This leads to that the oxidation of the barrier metal 3b covering the surface including the lower surface and the side surface of the via 7a is prevented from being promoted by the moisture in the interwiring insulating film 4b.

In addition, it is relatively easy to control the film thickness of the CuSiN film 9. Thus, the CuSiN film 9 can be formed as a super-thin film. The thinness of the film thickness means that the permittivity of the CuSiN film 9 itself hardly exerts an influence on the effective permittivity between the wirings. Note that, according to a simulation, an increase rate of the effective permittivity between the wirings when the CuSiN film 9 having a thickness of 2 nm is formed on the intervia insulating film, for example, in the 32 nm-node interconnect structure is not higher than 1%. Thus, an influence which the CuSiN film 9 exerts on the effective permittivity between the wirings is negligibly small.

In addition, the CuSiN film 9 can have a large etching selectivity with respect to each of the interwiring insulating film 4b and the intervia insulating film 8a. Thus, a possibility that the CuSiN film 9 is removed in the phase of formation of the wiring trench 10 and the via hole 11 is small. For this reason, the CuSiN film 9 is formed below the wiring 2b as well, so that it is possible to suppress the oxidation of the barrier metal 3b formed on the lower surface of the wiring 2b due to the moisture in the intervia insulating film 8a.

Second Embodiment

A semiconductor device according to a second embodiment is different from that of the first embodiment in position where a CuSiN film is formed. A description of the same respects, such as the structures of other members, as those in the first embodiment is omitted here for the sake of simplicity.

Figure 3:
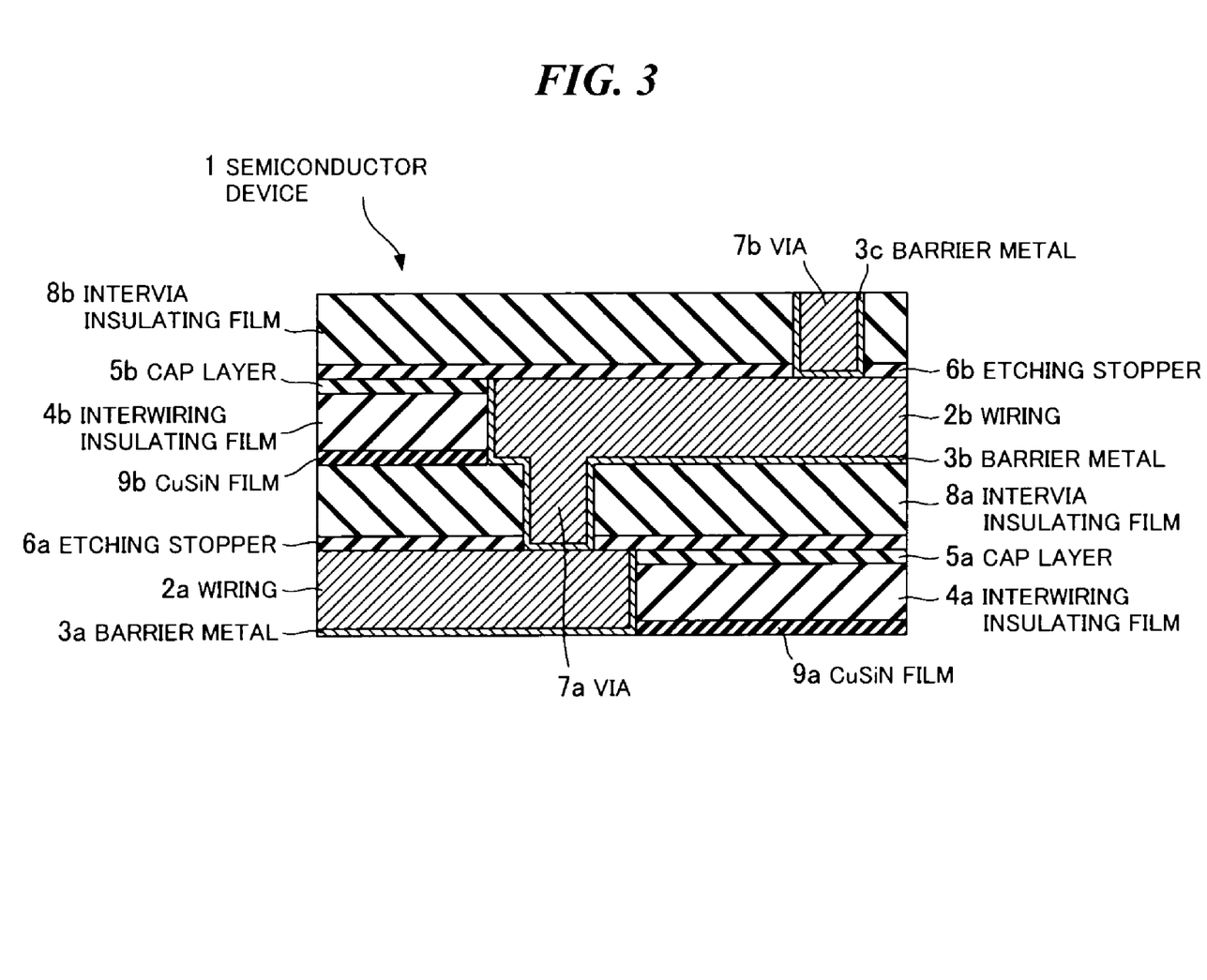
FIG. 3 is a cross sectional view of a semiconductor device according to a second embodiment.

FIG. 3 is a cross sectional view of the semiconductor device according to the second embodiment.

The semiconductor device 1 includes the semiconductor substrate (not shown) having the semiconductor element formed on its surface, and a multilayer interconnection structure laminated on the semiconductor substrate. FIG. 3 is a cross sectional view showing a part of the multilayer interconnection structure.

In this embodiment, a CuSiN film 9b is formed between the interwiring insulating film 4b and the intervia insulating film 8a, and also is not formed below the wiring 2b. In addition, the CuSiN film 9b is formed between the interwiring insulating film 4b and an intervia insulating film (not shown) underlying the CuSiN film 9b.

FIGS. 4A to 4D are respectively cross sectional views showing a method of fabricating the semiconductor device according to the second embodiment.

Figure 4A:
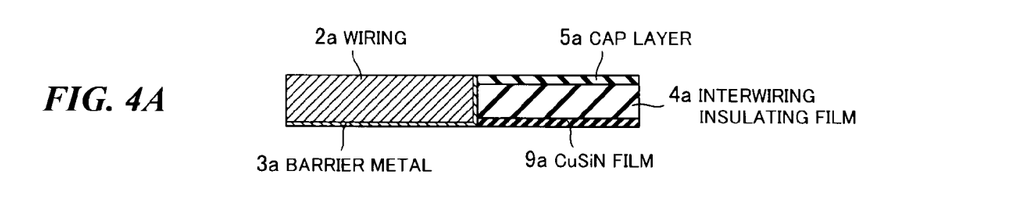
FIGS. 4A to 4D are respectively cross sectional views showing a method of fabricating the semiconductor device according to the second embodiment.

Firstly, as shown in FIG. 4A, the wiring 2a having the surface including the lower surface and the side surface covered with the barrier metal 3a, the CuSiN film 9a, the interwiring insulating film 4a, and the cap layer 5a are formed above the semiconductor substrate (not shown).

Figure 4B:
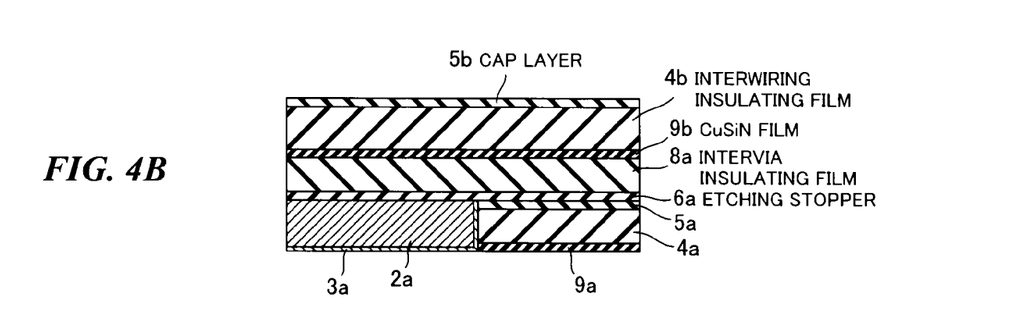

Next, as shown in FIG. 4B, the etching stopper 6a, the intervia insulating film 8a, the CuSiN film 9b, the interwiring insulating film 4b, and the cap layer 5b are laminated in order on the wiring 2a and the cap layer 5a.

Figure 4C:
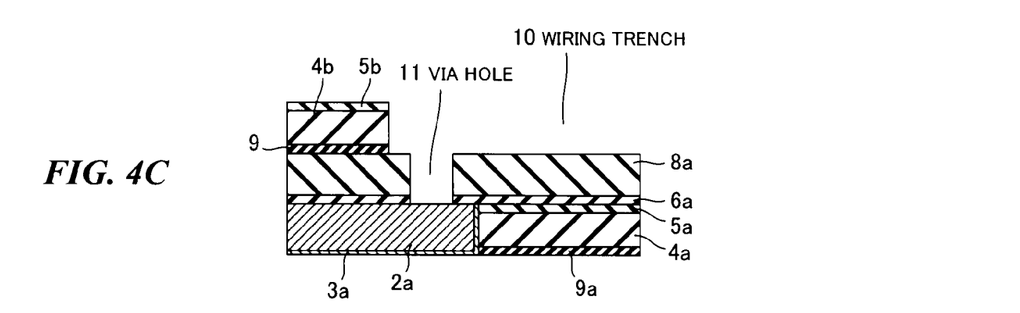

Next, as shown in FIG. 4C, the etching stopper 6a, the intervia insulating film 8a, the CuSiN film 9b, the interwiring insulating film 4b, and the cap layer 5b are processed in order by, for example, utilizing the photolithography method and the RIE method, thereby forming the wiring trench 10 and the via hole 11. In this embodiment, a portion of the CuSiN film 9b corresponding to a position where the wiring 2b is formed is removed. For this reason, a heat treatment is performed after completion of the formation of the wiring trench 10 and the via hole 11, thereby evaporating the moisture in the intervia insulating film 8a from the upper surface, of the intervia insulating film 8a, on which no CuSiN film 9b is formed. As a result, it is possible to reduce a moisture content of the intervia insulating film 8a. This heat treatment, for example, is performed at 300° C. for 60 seconds. In this embodiment, each of the CuSiN films 9a and 9b can be formed in the same processes as those for the CuSiN film 9 in the first embodiment described above.

It is noted that after the wiring trench 10 and the via hole 11 are formed, the inner surfaces of the wiring trench 10 and the via hole 11 which are damaged by the etching may be repaired. When each of the interwiring insulating film 4b and the intervia insulating film 8a, for example, is made of a material, such as methylsiloxane, having a siloxane bond as a main skeleton, the repair is carried out by recombining a portion having a defective methyl group owing to the etching with a hydrocarbon group such as a methyl group by using a repairing agent containing organic gas having a silanol group, an organic chemical or the like.

Figure 4D:
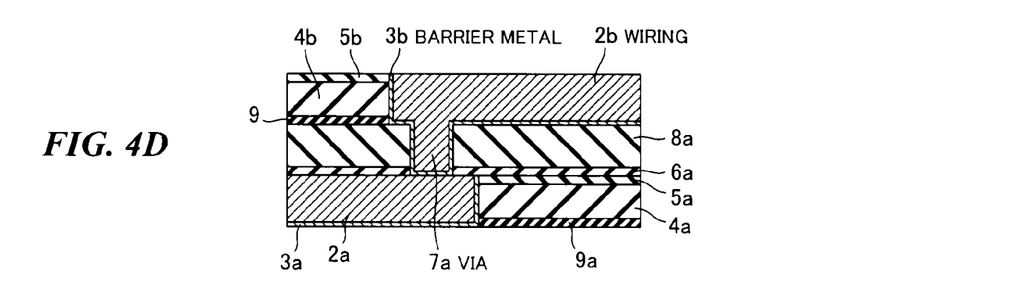

Next, as shown in FIG. 4D, the wiring 2b and the via 7a having the respective surfaces including the lower surfaces and the side surfaces covered with the barrier metal 3b are formed in the wiring trench 10 and the via hole 11, respectively.

Thereafter, the etching stopper 6b, the via 7c having the surface including the lower surface and the side surface covered with the barrier metal 3c, the intervia insulating film 8b, and the like are formed in the upper layer, thereby forming the semiconductor device 1 shown in FIG. 3.

According to the second embodiment, the formation of the CuSiN film 9 prevents the moisture in the interwiring insulating film 4b from moving to the intervia insulating film 8a similarly to the case of the first embodiment. This leads to that the oxidation of the barrier metal 3b covering the surface including the lower surface and the side surface of the via 7a is prevented from being promoted by the moisture in the interwiring insulating film 4b.

In addition, the heat treatment is performed to evaporate the moisture in the intervia insulating film 8a from the upper interface, of the intervia insulating film 8a, on which no CuSiN film 9b is formed. As a result, it is possible to reduce the moisture content of the intervia insulating film 8a. This leads to suppression of the oxidation of the barrier metal 3b covering the surface including the lower surface and the side surface of the via 7a.

Third Embodiment

A semiconductor device according to a third embodiment is different from that of the first embodiment in position where a CuSiN film is formed. A description of the same respects, such as the structures of other members, as those in the first embodiment is omitted here for the sake of simplicity.

Figure 5:
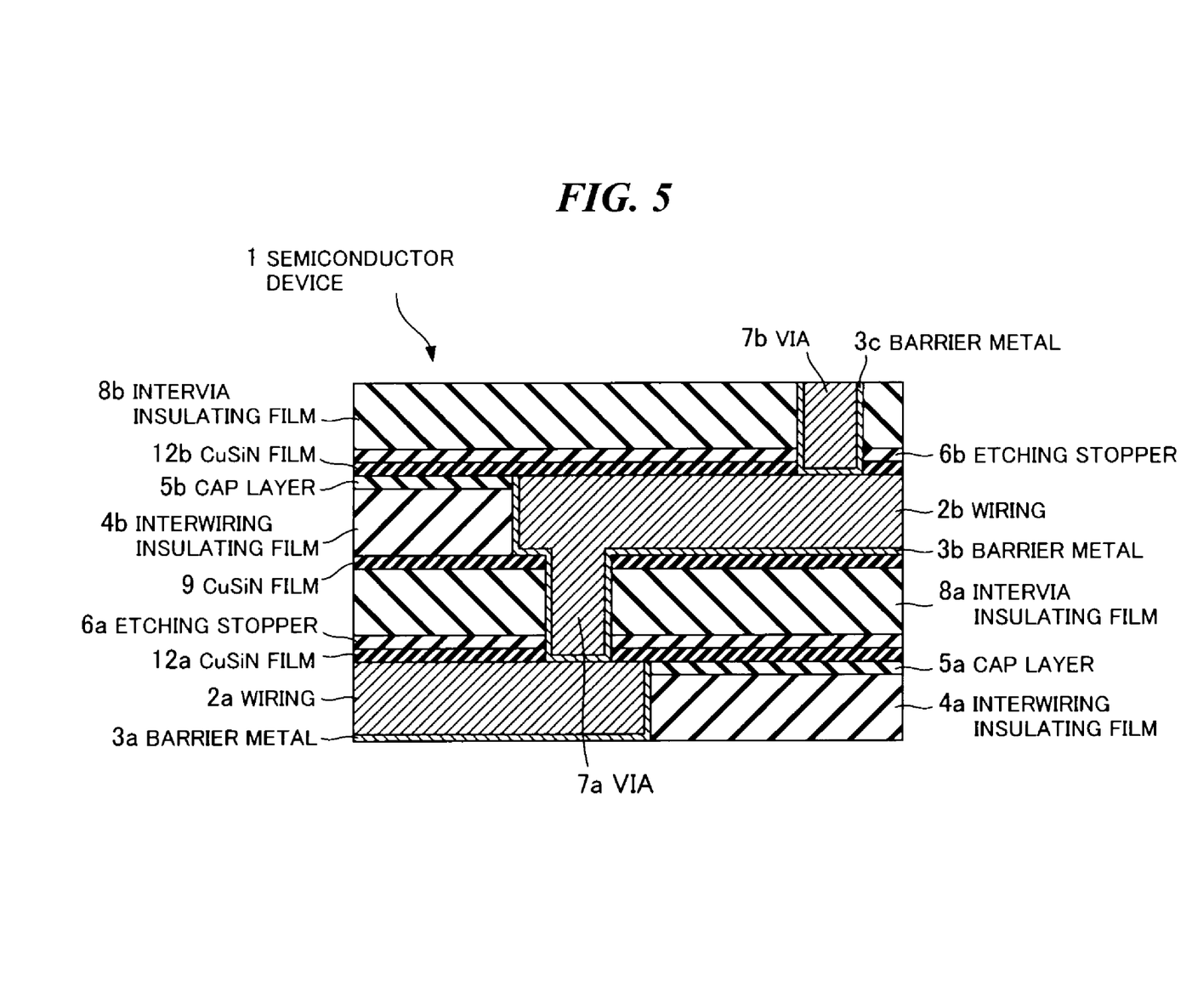
FIG. 5 is a cross sectional view of a semiconductor device according to a third embodiment.

FIG. 5 is a cross sectional view of the semiconductor device according to the third embodiment.

The semiconductor device 1 includes the semiconductor substrate (not shown) having the semiconductor element formed on its surface, and a multilayer interconnection structure laminated on the semiconductor substrate. FIG. 5 is a cross sectional view showing a part of the multilayer interconnection structure.

In this embodiment, the CuSiN film 9 is formed between the interwiring insulating film 4b and the intervia insulating film 8a, and between the wiring 2b and the intervia insulating film 8a. In addition, a CuSiN film 12a is formed between the cap layer 5a and the etching stopper 6a, and between the wiring 2a and the etching stopper 6a. Also, a CuSiN film 12b is formed between the cap layer 5b and the etching stopper 6b, and between the wiring 2b and the etching stopper 6b. Each of the CuSiN films 12a and 12b is formed in the same processes as those for the CuSiN film 9.

It is noted that the CuSiN film 9 may have a shape in which the portion thereof lying below the wiring 2b is removed similarly to the case of the CuSiN film 9b in the second embodiment. In addition, a structure may also be adopted such that the CuSiN films 12a and 12b are not formed on the wirings 2a and 2b, respectively, but are formed only on the cap layers 5a and 5b, respectively. In addition, a structure may also be adopted such that the CuSiN film 9b is not formed, but only CuSiN films 12a and 12b are formed.

According to the third embodiment, the CuSiN films 12a and 9 are formed between the intervia insulating film 8a and the lower interwiring insulating film 4a, and between the intervia insulating film 8a and the upper interwiring insulating film 4b, respectively, thereby making it possible to prevent the moisture in the upper and lower interwiring insulating films 4b and 4a from moving to the intervia insulating film 8a. This leads to that the oxidation of the barrier metal 3b covering the surface including the lower surface and the side surface of the via 7a can be more effectively suppressed. In addition, the oxidation of the barrier metal 3c covering the surface including the lower surface and the side surface of the via 7b can be similarly suppressed.

Fourth Embodiment

A semiconductor device according to a fourth embodiment is different from that of the first embodiment in that air gaps are formed in corresponding one of the interwiring insulating films. A description of the same respects, such as the structures of other members, as those in the first embodiment is omitted here for the sake of simplicity.

Figure 6:
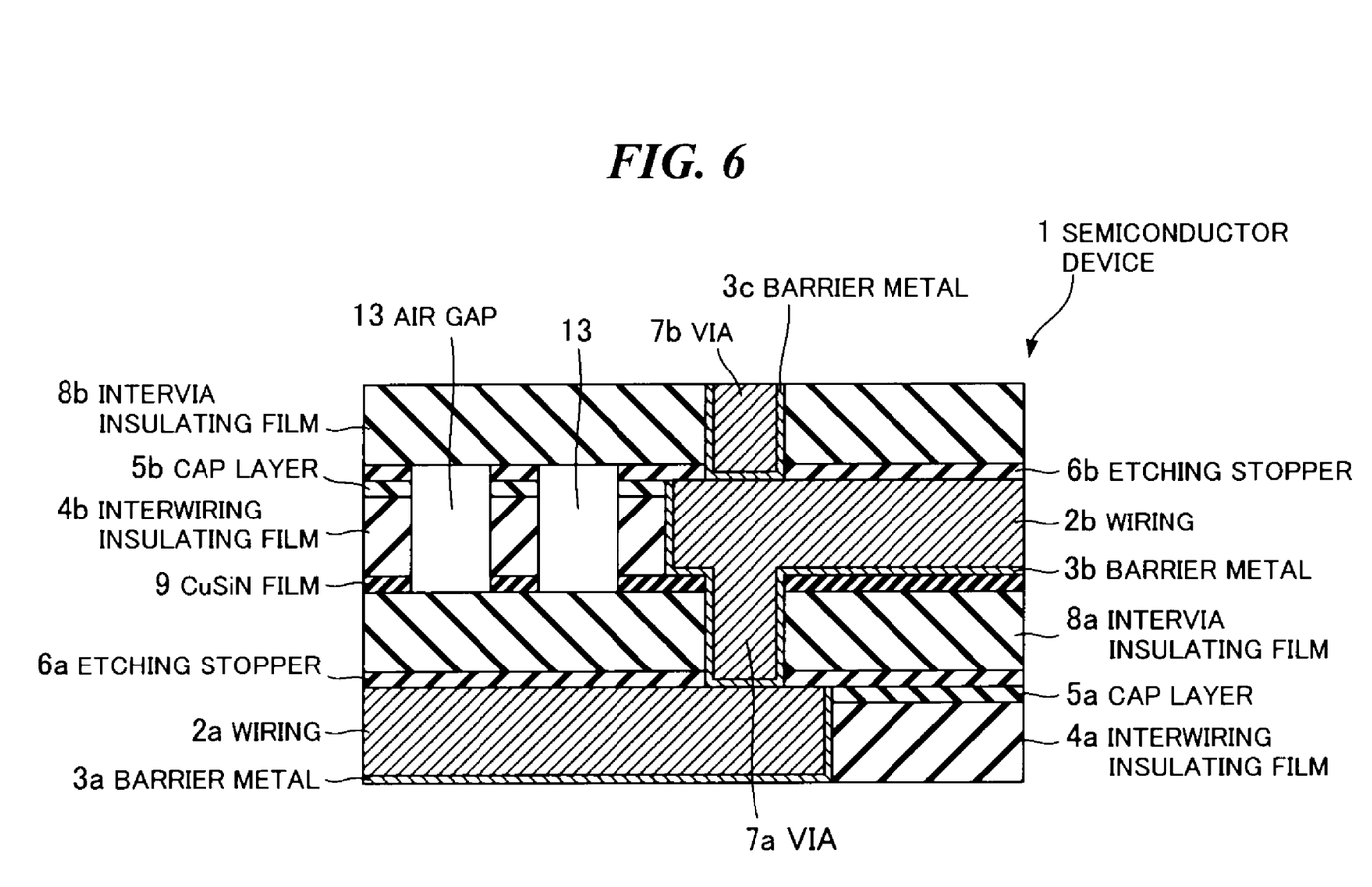
FIG. 6 is a cross sectional view of a semiconductor device according to a fourth embodiment.

FIG. 6 is a cross sectional view of the semiconductor device according to the fourth embodiment.

The semiconductor device 1 includes the semiconductor substrate (not shown) having the semiconductor element formed on its surface, and a multilayer interconnection structure laminated on the semiconductor substrate. FIG. 6 is a cross sectional view showing a part of the multilayer interconnection structure.

In this embodiment, each of air gaps 13 is formed in the interwiring insulating film 4b, the CuSiN film 9, the cap layer 5b, and the etching stopper 6b. It is noted that a disposition of the air gaps 13 is by no means limited to that shown in FIG. 6. In addition, each of the air gaps 13 may be formed in the interwiring insulating film 4a as well.

In addition, the CuSiN film 9 may have a shape in which the portion thereof lying below the wiring 2b is removed similarly to the case of the CuSiN film 9b in the second embodiment. Also, similarly to the case of the third embodiment, the CuSiN film 12a may be formed between the wiring 2a and the etching stopper 6a, and between the cap layer 5a and the etching stopper 6a, and the CuSiN film 12b may be formed between the wiring 2b and the etching stopper 6b, and between the cap layer 5b and the etching stopper 6b, respectively. Or, the CuSiN films 12a and 12b may be formed between the cap layer 5a and the etching stopper 6a, and between the cap layer 5b and the etching stopper 6b, respectively.

Figure 7A:
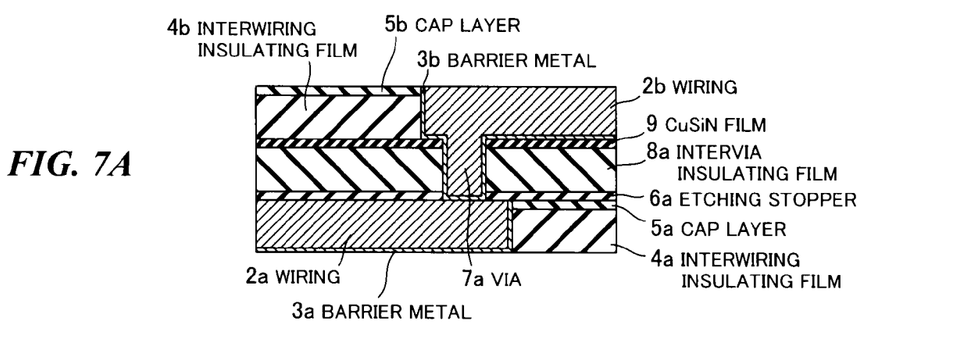
FIGS. 7A to 7C are respectively cross sectional views showing a method of fabricating the semiconductor device according to the fourth embodiment.
Figure 7B:
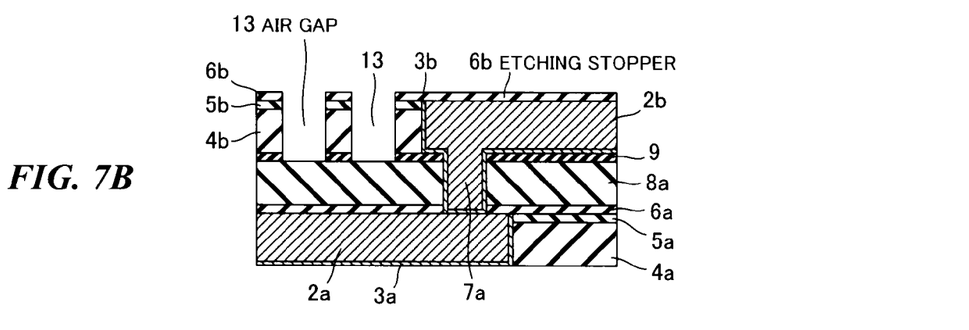
Figure 7C:
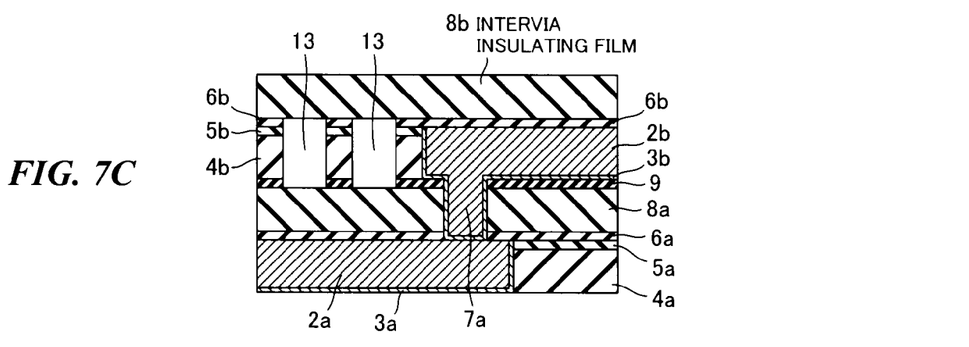

FIGS. 7A to 7C are respectively cross sectional views showing a method of fabricating the semiconductor device according to the fourth embodiment.

Firstly, as shown in FIG. 7A, the processes up to the formation of the wiring 2b shown in FIG. 2D in the first embodiment are performed.

Next, as shown in FIG. 7B, after the etching stopper 6b is formed, the etching stopper 6b, the cap layer 5b, the interwiring insulating film 4b, and the CuSiN film 9 are processed in order by, for example, utilizing the photolithography method and the RIE method, thereby forming the air gaps 13. It is noted that a heat treatment is performed after completion of the formation of the air gaps 13 to evaporate the moisture in the intervia insulating film 8a through the air gaps 13, thus making it possible to reduce the moisture content of the intervia insulating film 8a.

Next, as shown in FIG. 7C, the intervia insulating film 8b is formed on the etching stopper 6b so as to cover the air gaps 13.

After that, the via 7b having the surface including the lower surface and the side surface covered with the barrier metal 3c is formed in the intervia insulating film 8b, thereby forming the semiconductor device 1 shown in FIG. 6.

According to the method of fabricating the semiconductor device 1 described in the first embodiment, it is feared that not only the CuSiN film 9, but also the conductive material such as the Cu film are simultaneously formed when the CuSiN film 9 is formed. When such a conductive material is formed on the surface or inside of the CuSiN film 9, it is feared that a leakage current is caused to flow through the wirings. Thus, according to the fourth embodiment, although the partial dividing of the CuSiN film 9 by the formation of the air gaps 13 reduces the effect of suppressing the movement of the moisture, it is possible to prevent the leakage current from being caused to flow through the wirings due to the existence of the conductive material.

In addition, the formation of the air gaps 13 makes it possible to reduce an interwiring capacitance between the wiring 2b and its peripheral wiring (not shown).

Other Embodiments

It is noted that the present invention is by no means limited to the embodiments described above, and thus various changes can be made without departing from the gist of the invention.

Moreover, the constituent elements of the embodiments described above can be arbitrarily combined with one another without departing from the gist of the invention.

What is claimed is:

1. A semiconductor device, comprising:
   a semiconductor substrate having a semiconductor element formed on a surface thereof;
   an interwiring insulating film formed above the semiconductor substrate;
   a wiring formed in the interwiring insulating film;
   a first intervia insulating film formed under the interwiring insulating film;
   a first via formed in the first intervia insulating film and connected to a lower surface of the wiring;
   a second intervia insulating film formed on the interwiring insulating film;
   a second via formed in the second intervia insulating film and connected to an upper surface of the wiring; and a CuSiN film formed in at least one of first and second positions, the first position being between the interwiring insulating film and the first intervia insulating film, the second position being between the interwiring insulating film and the second intervia insulating film.

2. The semiconductor device according to claim 1, wherein when the CuSiN film is formed in the first position, the CuSiN film is further formed between the wiring and the first intervia insulating film, and when the CuSiN film is formed in the second position, the CuSiN film is further formed between the wiring and the second intervia insulating film.

3. The semiconductor device according to claim 1, wherein an air gap is formed in the interwiring insulating film and the CuSiN film.

4. The semiconductor device according to claim 1, wherein the CuSiN film has a thickness of 1 to 10 nm.

5. The semiconductor device according to claim 1, wherein each of the first and second vias has barrier metals on their surfaces, respectively.

6. The semiconductor device according to claim 5, wherein the barrier metal contains at least one of Ta, Ti, W, Ru, and Co.

7. The semiconductor device according to claim 1, wherein each of the first and second intervia insulating films contains at least one of SiOC, $SiO_2$, SiOCH, and SiOF.

8. The semiconductor device according to claim 1, wherein the interwiring insulating film contains at least one of SiOC, $SiO_2$, SiOCH, SiOF, and an organic insulating material.

9. The semiconductor device according to claim 1, wherein a cap layer made of an insulating material is formed on the interwiring insulating film.

10. The semiconductor device according to claim 1, wherein the CuSiN film is also formed between the lower surface of the wiring and the first intervia insulating film.

11. The semiconductor device according to claim 1, wherein an etching stopper made of an insulating material is formed under the intervia insulating film.

12. The semiconductor device according to claim 1, wherein the CuSiN film is also formed between the upper surface of the wiring and the second intervia insulating film.

13. The semiconductor device according to claim 10, wherein the CuSiN film formed in the position between the interwiring insulating film and the first intervia insulating film and the CuSiN film formed between the lower surface of the wiring and the first intervia insulating film have substantially constant thickness.

14. The semiconductor device according to claim 1, wherein the CuSiN film is formed at a position other than between the wiring and the second intervia insulating film.

* * * * *